United States Patent
Kajikawa

(10) Patent No.: US 7,436,326 B2
(45) Date of Patent: Oct. 14, 2008

(54) OPERATION INPUT DEVICE

(75) Inventor: Chikashi Kajikawa, Osaka (JP)

(73) Assignee: Kyocera Mita Corporation, Osaka (JP)

( * ) Notice: Subject to any disclaimer, the term of this patent is extended or adjusted under 35 U.S.C. 154(b) by 514 days.

(21) Appl. No.: 11/268,776

(22) Filed: Nov. 8, 2005

(65) Prior Publication Data

US 2006/0152389 A1 Jul. 13, 2006

(30) Foreign Application Priority Data

Nov. 10, 2004 (JP) ............................. 2004-326715

(51) Int. Cl.
*H03M 11/00* (2006.01)
(52) U.S. Cl. .............................. 341/23; 341/22; 341/34; 345/172; 708/145
(58) Field of Classification Search .................. 341/20, 341/22, 23, 34, 26; 708/145; 345/172
See application file for complete search history.

(56) References Cited

U.S. PATENT DOCUMENTS

| | | | | | |
|---|---|---|---|---|---|
| 4,202,038 | A | * | 5/1980 | Petersson | ..................... 708/145 |
| 5,007,008 | A | * | 4/1991 | Beers | ......................... 708/145 |
| 5,252,971 | A | * | 10/1993 | Franz et al. | ................... 341/26 |
| 5,258,748 | A | * | 11/1993 | Jones | .......................... 345/172 |
| 5,510,783 | A | * | 4/1996 | Findlater et al. | .............. 341/34 |
| 5,515,040 | A | * | 5/1996 | Lee et al. | ................ 340/870.04 |
| 5,594,673 | A | * | 1/1997 | Coffin | ......................... 708/145 |
| 5,745,376 | A | * | 4/1998 | Barker et al. | ................... 702/41 |
| 6,727,830 | B2 | * | 4/2004 | Lui et al. | ....................... 341/20 |

FOREIGN PATENT DOCUMENTS

| | | |
|---|---|---|
| JP | 5-313806 | 11/1993 |
| JP | 11-53092 | 2/1999 |
| JP | 2000-99184 | 4/2000 |
| JP | 2004-178364 | 6/2004 |
| JP | 2004-181775 | 7/2004 |

OTHER PUBLICATIONS

Office Action in Japanese Patent Application No. 2004-326715.

* cited by examiner

*Primary Examiner*—Albert K Wong
(74) *Attorney, Agent, or Firm*—Smith, Gambrell & Russell, LLP

(57) ABSTRACT

An operation input device according to the present invention displays a plurality of keys (7) on a liquid crystal panel (6), and prompts a user to press the keys (7) in the order of numbers assigned to the respective keys (7). On the basis of key pressing periods during which the respective keys (7) are pressed, the characteristics of a key input operation performed by the user (the average and standard deviation of the pressing periods) are detected, and judgment reference values are determined on the basis of the detected characteristics for judgment of the type of the user's key input operation (an ordinary key input operation, a longer pressing key input operation or a double click key input operation). When a key input operation is performed, the type of the key input operation is judged on the basis of the judgment reference values thus determined, and a process according to the judged key input operation type is performed.

11 Claims, 3 Drawing Sheets

OPERATION INPUT DEVICE

FIELD OF THE INVENTION

The present invention relates to an operation input device on which a key input operation is performed.

BACKGROUND OF THE INVENTION

Electrical appliances such as image forming apparatuses generally include an operation input section on which a key input operation is performed for setting functions (see, for example, Japanese Unexamined Patent Publication No. 2004-181775).

In some case, a plurality of functions are assigned to one key and executed depending on the way of pressing the key. Unless pressing the key in a correct way, a user cannot perform a desired key input operation. For example, key input operations to be performed by pressing one key include: inputting a specific value (e.g., "1") by pressing the key for 0.5 second; inputting a signal for cancellation of the input value ("1" in this case) by pressing the key twice in one second; and inputting another value (e.g., "10") by continuously pressing the key for not shorter than one second. In this case, the user can input a desired value or cancel the input value only when the user correctly presses the key for the corresponding key pressing period preliminarily defined.

However, the key pressing period for performing the key input operation varies depending on the user, so that a predetermined allowance should be provided to the key pressing period for detection of the key input operation in the case of a shared image forming apparatus. However, a greater allowance of the key pressing period for the detection of the key input operation is not preferred, because a user's unintended input (disturbance) caused, for example, by inadvertently touching the key for a moment is mistakenly regarded as a key input operation.

SUMMARY OF THE INVENTION

In view of the foregoing, it is an object of the present invention to provide an operation input device which is capable of properly detecting a key input operation performed by a user.

It is another object of the present invention to provide an operation input device having an improved operability.

According to the present invention, an operation input device having a key for inputting a plurality of command signals according to a way of pressing the key comprises: measurement means which measures a key pressing period; means which judges the type of a key input operation by comparing the measured key pressing period with a predefined judgment reference value; means which performs a process according to the judged key input operation type; and means which updates the judgment reference value on the basis of the measured key pressing period in a predetermined mode.

According to this operation input device, the judgment reference value is updated for each user or each user group. Therefore, key pressing periods are measured for each user or each user group, so that the judgment reference value can be increased or reduced according to the characteristics of the key pressing periods for the user or the user group. Hence, the operation input device reflects the tendency of the user or the user group in pressing the key, so that the user or the user group can correctly perform the key input operation.

BEST MODE FOR CARRYING-OUT OF THE INVENTION

A specific embodiment of the present invention will hereinafter be described with reference to the drawings.

Figure 1:
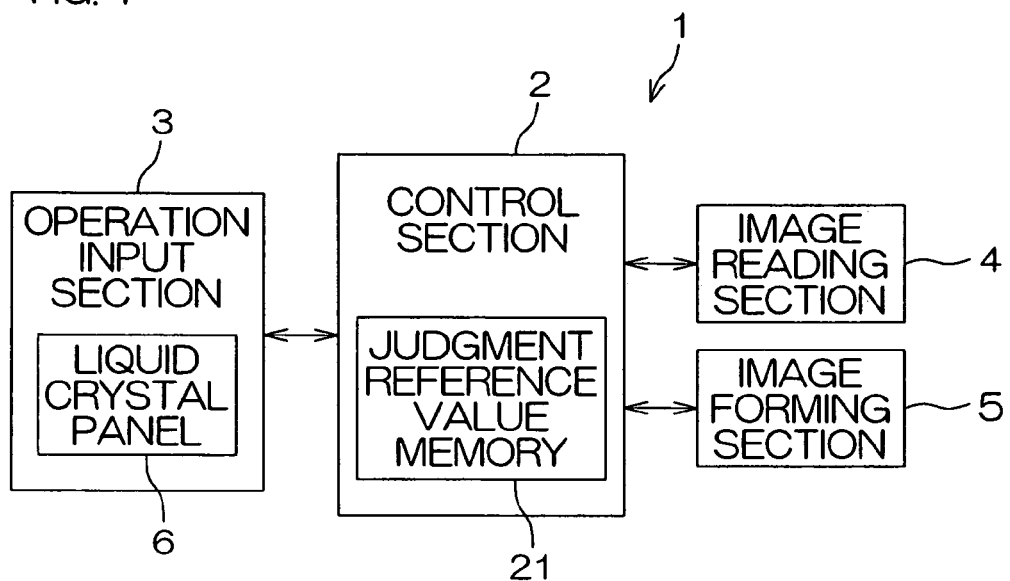
FIG. 1 is a block diagram illustrating the electrical construction of an image forming apparatus as an operation input device according to one embodiment of the present invention.

FIG. 1 is a block diagram illustrating the electrical construction of an image forming apparatus 1 as an operation input device according to one embodiment of the present invention.

Referring to FIG. 1, the image forming apparatus 1 includes a control section 2 including a microprocessor, an operation input section 3 electrically connected to the control section 2, an image reading section 4 and an image forming section 5.

The image reading section 4 has a known construction, for example, including a light source and a CCD line sensor, and is adapted to acquire original image data by irradiating an original image with light from the light source and receiving reflected light by the CCD line sensor.

The image forming section 5 has a known construction, for example, including a photosensitive body, a main charger, a developing device and a transfer device. In image formation, a generally cylindrical surface of the photosensitive body is uniformly electrically charged by the main charger, and irradiated with light on the basis of the image data, whereby a so-called electrostatic latent image is formed on the surface of the photosensitive body. Toner is selectively applied on the surface of the photosensitive body formed with the electrostatic latent image by the developing device, whereby a toner image is formed on the surface of the photosensitive body. Then, the toner image formed on the surface of the photosensitive body is transferred onto a paper sheet by the action of the transfer device.

The operation input section 3 includes a liquid crystal panel 6 mounted with a touch panel. A predetermined display image such as including keys to be pressed is displayed on the liquid crystal panel 6 on the basis of a control signal from the control section 2. A user performs a key input operation by pressing any of the keys displayed on the liquid crystal panel 6. Upon pressing of the key, a signal corresponding to the key is inputted to the control section 2.

The control section 2 includes measurement means for measuring a key pressing period, judgment means for determining the type of the key input operation, and update means for updating judgment reference values. These are functional means to be implemented on a software basis as will be described later. The control section 2 further includes a memory 21 which stores the judgment reference values. In the memory 21, the judgment reference values are stored for each user or each user group.

The image forming apparatus 1 prompts the user to perform key input operations on the liquid crystal panel 6, measures key pressing periods during which the user presses the respective keys for the key input operations, detects the characteristics of the key input operations performed by the user (the average and standard deviation of the key pressing periods), and determines the judgment reference values for judging the type of a key input operation performed by the user on the basis of the detected characteristics in a judgment reference value determining mode.

Figure 2:
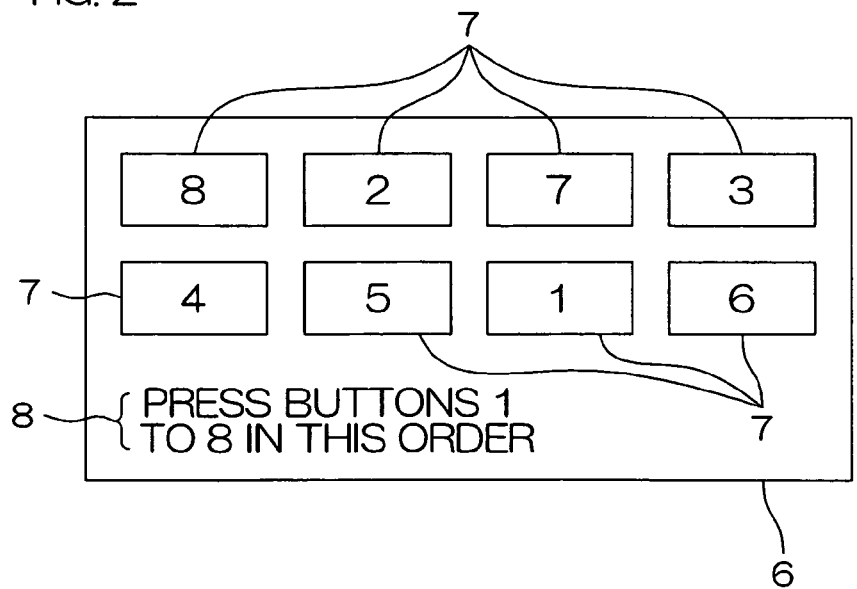
FIG. 2 is a diagram illustrating a specific example of an image displayed on a liquid crystal panel in a judgment reference value determining mode.

FIG. 2 is a diagram illustrating a specific example of an image displayed on the liquid crystal panel 6 in the judgment reference value determining mode.

Referring to FIG. 2, a plurality of keys 7 (e.g., eight keys) are displayed on the liquid crystal panel 6 in the judgment reference value determining mode. Different numbers (e.g., serial numbers from "1" to "8") are respectively assigned to the keys 7, and arranged at random. A message 8 for prompting the user to press the keys 7 in numerical order is displayed on the liquid crystal panel 6.

Figure 3:
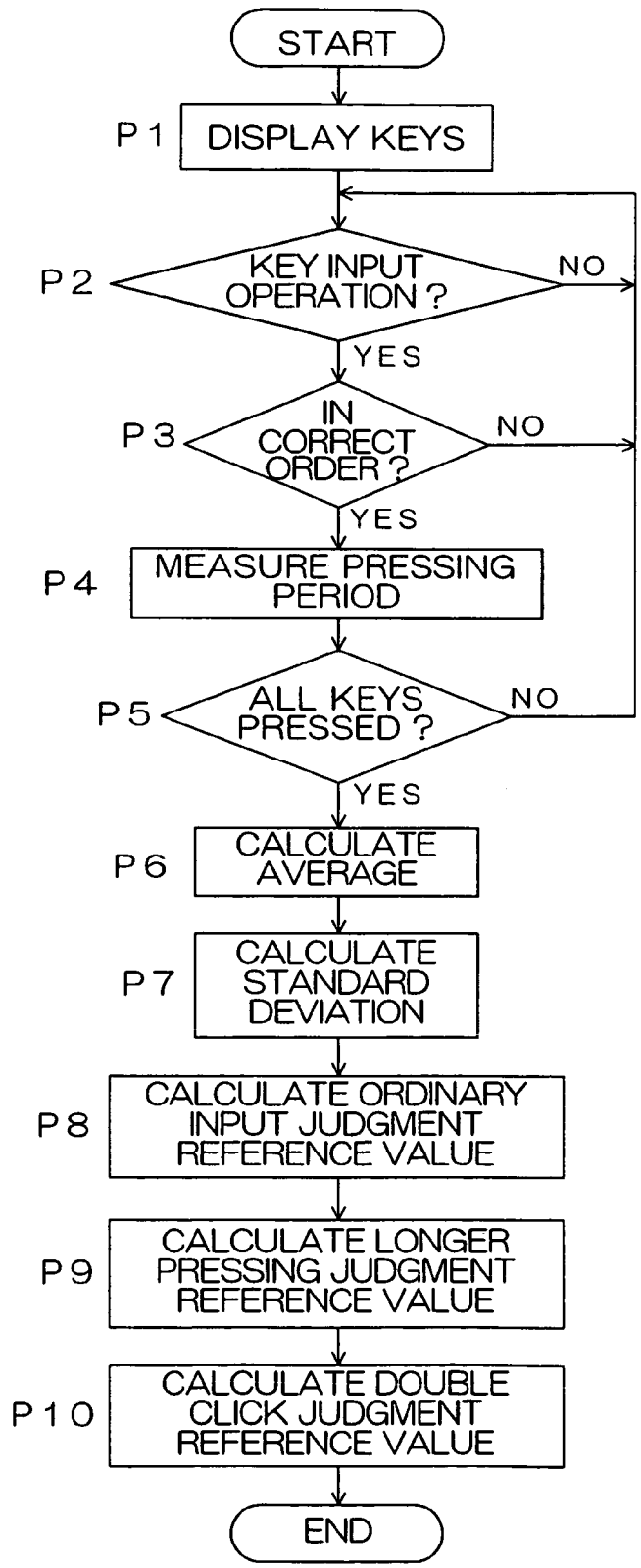
FIG. 3 is a flow chart illustrating the flow of control to be performed by a control section in the judgment reference value determining mode.

FIG. 3 is a flow chart illustrating the flow of control to be performed by the control section 2 in the judgment reference value determining mode.

Referring to FIG. 3, when the user operates the operation input section 3 to invoke the judgment reference value determining mode, the control section 2 performs a display operation on the liquid crystal panel 6 as shown in FIG. 2 to display the plurality of keys 7 on the liquid crystal panel 6 (Step P1), and monitors whether the keys 7 are pressed (whether key input operations are performed) (Step P2). Prior to the display of the plurality of keys 7, a user ID for identification of the user is inputted. The apparatus identifies the user on the basis of the user ID, and judgment reference values to be described later are correlated with the user.

If any of the keys 7 displayed on the liquid crystal panel 6 is pressed (YES in Step P2) and the keys 7 are pressed in correct order (in the order of the numbers displayed in the respective keys 7) (YES in Step P3), the control section 2 measures a key pressing period during which the key 7 is pressed or a period from a time point at which a user's finger touches the key to a time point at which the user's finger is released from the key (Step P4).

The control section 2 repeatedly performs the aforesaid control from Step P1 to Step P4 until all the keys displayed on the liquid crystal panel 6 are pressed. After all the keys 7 are pressed (YES in Step P5), the average TB of the key pressing periods is calculated from the following expression (1) (Step P6).

$$TB=\Sigma TN/n \quad (1)$$

wherein TN (N=1 to 8) is a key pressing period during which the keys 7 are each pressed, and n is the number of times of key pressing.

Thereafter, the control section 2 calculates a standard deviation σ from the following expression (2) (Step P7).

$$\sigma=\sqrt{(\Sigma(TN-TB)^2/n)} \quad (2)$$

In this embodiment, judgment reference values (an ordinary input judgment reference value TS, a longer pressing judgment reference value TL and double click judgment reference values TD1, TD2) for judging three types of key input operations including an ordinary key input operation (one-time pressing key input operation), a longer pressing key input operation and a double click key input operation (two-time pressing key input operation) are determined in the judgment reference value determining mode. That is, after the calculation of the standard deviation σ (Step P7), the control section 2 calculates the ordinary input judgment reference value TS, the longer pressing judgment reference value TL and the double click judgment reference values TD1, TD2 from the following expressions (3) to (6) (Steps P8 to P10). Then, the judgment reference value determining mode is ended.

$$TS=TB-3\sigma \quad (3)$$

$$TL=TB+3\sigma \quad (4)$$

$$TD1=2TB \quad (5)$$

$$TD2=3TB \quad (6)$$

If the ordinary input judgment reference value TS calculated from the above expression (3) is negative, a predetermined value may be used instead of the negative ordinary input judgment reference value TS.

The judgment reference values determined in the aforesaid manner are correlated with the user ID. Thus, a set of judgment reference values is determined for each user or each group (or each section) including a plurality of users, and stored in the memory. Where the judgment reference values are determined for each user, the average TB and the standard deviation σ are calculated on the basis of key pressing periods TN measured when the single user presses the keys 7 for the calculation of the judgment reference values TS, TL, TD1, TD2. Where the judgment reference values are determined for each group of users, the average TB and the standard deviation a are calculated on the basis of key pressing periods TN measured when the users press the keys 7 for the calculation of the judgment reference values TS, TL, TD1, TD2.

Whenever the judgment reference value determining mode is invoked, the judgment reference values TS, TL, TD1, TD2 previously calculated may be updated with judgment reference values TS, TL, TD1, TD2 currently calculated. Alternatively, the judgment reference values TS, TL, TD1, TD2 calculated on the basis of the key pressing periods TN measured on different occasions in the judgment reference value determining mode may be summed up, and averages of the judgment reference values may be used for the update of the judgment reference values.

An arrangement for prompting the user to double-click any of the keys displayed on the liquid crystal panel 6, measuring a period from the start to the end of the double click and two key pressing periods and calculating the double click judgment reference value on the basis of these measurement results in the judgment reference value determining mode may be additionally employed.

Figure 4:
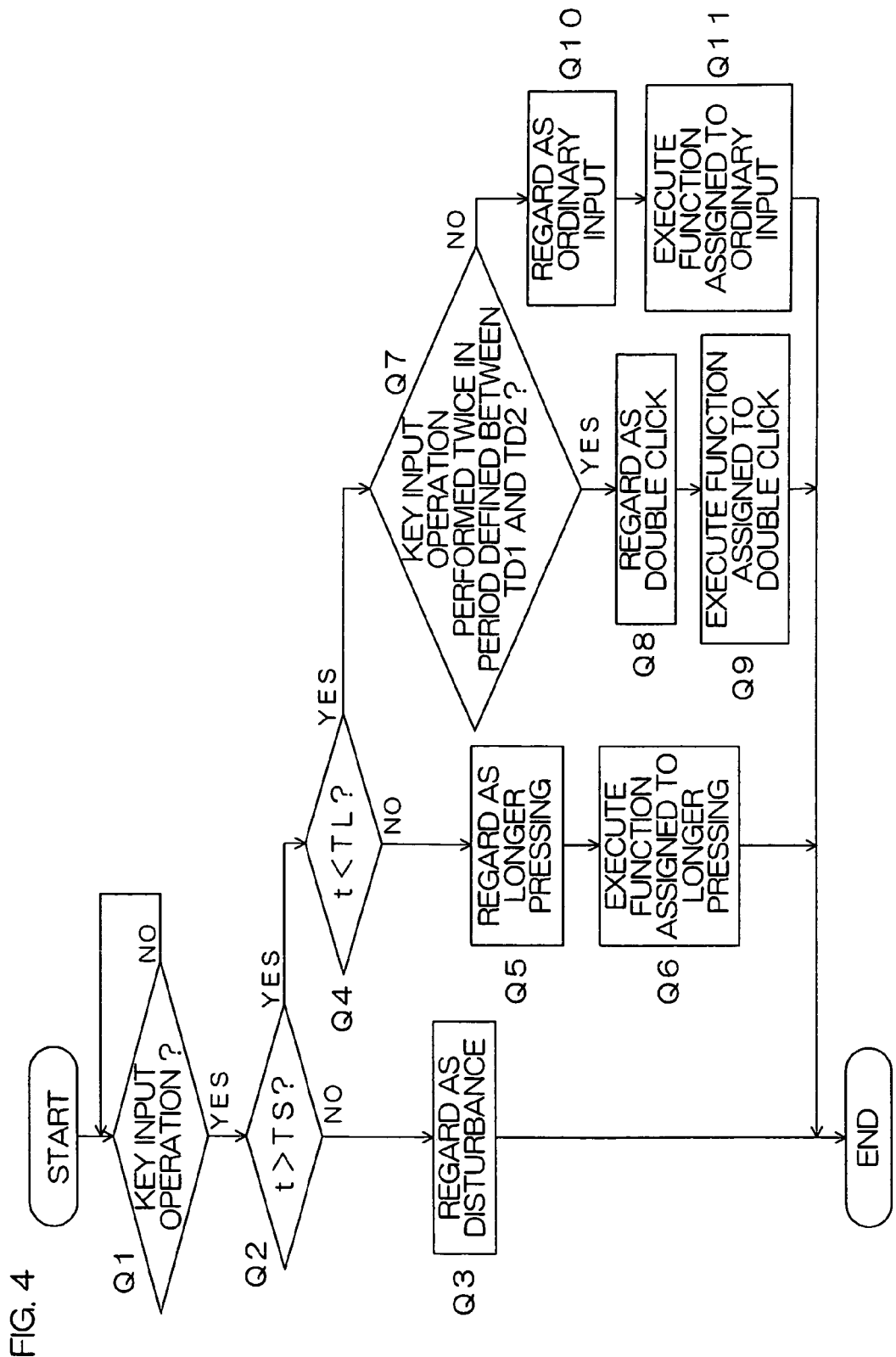
FIG. 4 is a flow chart illustrating the flow of a process to be performed by the control section on the basis of a judgment reference value determined in the judgment reference value determining mode.

FIG. 4 is a flow chart illustrating the flow of a process to be performed for a user's key input operation by the control section 2 on the basis of the judgment reference values TS, TL, TD1, TD2 determined in the judgment reference value determining mode.

At least one of the keys displayed on the liquid crystal panel 6 of the operation input section 3 in a mode other than the judgment reference value determining mode has different functions which are respectively assigned to the ordinary key input operation, the longer pressing key input operation and the double click key input operation to be performed on the key. In the ordinary key input, the user first inputs the user ID, and then the process of FIG. 4 is started.

Referring to FIG. 4, if a key input operation is performed on the one key displayed on the liquid crystal panel 6 of the operation input section 3 in the mode other than the judgment reference value determining mode (YES in Step Q1), the control section 2 judges whether a key pressing period t measured at this time is longer than the ordinary input judgment reference value TS for the user (Step Q2). If the key pressing period t is not longer than the ordinary input judgment reference value TS (NO in Step Q2), the control section 2 regards the key input operation as a disturbance (e.g., an unintended input caused, for example, when the user inadvertently touches the key for a moment) (Step Q3), so that no process is performed in response to the key input operation.

If the key pressing period t is longer than the ordinary input judgment reference value TS (YES in Step Q2), the control section 2 judges whether the key pressing period t is shorter than the longer pressing judgment reference value TL for the user (Step Q4). If the key pressing period t is not shorter than the longer pressing judgment reference value TL (NO in Step Q4), the control section 2 regards the key input operation as the longer pressing key input operation (Step Q5), and executes the function assigned to the longer pressing key input operation for the key (Step Q6).

If the key pressing period t is shorter than the longer pressing judgment reference value TL (YES in Step Q4), the control section 2 judges, on the basis of the double click judgment reference values TD1, TD2 for the user, whether the key input operation is performed twice during a period defined between the double click judgment reference values TD1 and TD2 (Step Q7). If the key input operation is performed twice in the period defined between the values TD1 and TD2 (YES in Step Q7), the control section 2 regards the key input operation as the double click key input operation (Step Q8), and executes the function assigned to the double click key input operation for the key (Step Q9).

On the other hand, if the key input operation is not performed twice in the period defined between the values TD1 and TD2 (NO in Step Q7), the control section 2 regards the key input operation as the ordinary key input operation (Step Q10), and executes the function assigned to the ordinary key input operation for the key (Step Q11).

In this embodiment, even if the key input operation is performed twice in the period defined between the double click judgment reference values TD1 and TD2 (YES in Step Q7) when the pressing period t in the key input operation is not shorter than the longer pressing judgment reference value TL (NO in Step Q4), the key input operation is preferentially regarded as the longer pressing key input operation (Step Q5). However, this arrangement is not limitative. Alternatively, even if the pressing period t is not shorter than the longer pressing judgment reference value TL when the input operation is performed twice in the period defined between the double click judgment reference values TD1 and TD2 , the key input operation may be preferentially regarded as the double click key input operation. In this case, a user's operation may define which of the longer pressing key input operation and the double click key input operation is preferential.

In this embodiment, a set of judgment reference values TS, TL, TD1, TD2 is determined for each user or each group of users by measuring the pressing periods during which the respective users press the keys 7 and detecting the characteristics of the key input operations performed by the users (the averages TB and standard deviations σ of the pressing periods) on the basis of the measured key pressing periods. Therefore, a key input operation performed by a user can be properly detected by determining the type of the user's key input operation on the basis of the judgment reference values TS, TL, TD1, TD2 determined for that user or a user group to which the user belongs.

Further, the plural types of key input operations (e.g., the ordinary key input operation, the longer pressing key input operation and the double click key input operation) are defined, and the judgment reference values (the ordinary input judgment reference value TS, the longer pressing judgment reference value TL and the double click judgment reference values TD1, TD2) are defined for the respective types of key input operations. Thus, different processes are assigned to a single key as correlated with the respective types of key input operations. This makes it possible to perform a greater number of processes by operating a smaller number of keys, thereby improving the operability.

In the judgment reference value determining mode, the judgment reference values TS, TL, TD1, TD2 can be properly determined by prompting the user to press three or more keys 7 (e.g., eight keys) in the predetermined order and accurately detecting the characteristics of the user's key input operations (the average TB and standard deviation σ of the pressing periods).

It should be understood that the present invention is not limited to the embodiment described above, but various modifications may be made within the scope of the present invention defined by the following claims.

For example, the judgment reference values TS, TL, TD1, TD2 are not necessarily required to be determined in the judgment reference value determining mode, but may be automatically determined when the user performs an ordinary operation on the operation input section 3 (liquid crystal panel 6).

The operation input section 3 is not necessarily required to include the liquid crystal panel 6, but may include hard keys. In this case, the judgment reference values may be determined for key input operations performed on the hard keys by measuring hard key pressing periods.

In the embodiment described above, the image forming apparatus 1 is employed as an example of the operation input device, but the present invention is applicable not only to the image forming apparatus 1 but also to apparatuses such as PDAs and mobile phones on which a key input operation is performed.

The disclosure of Japanese patent application Serial No.2004-326715, filed on Nov. 10, 2004, is incorporated herein by reference.

The invention claimed is:

1. An operation input device comprising:
 a key for inputting a plurality of command signals according to a way of pressing the key;
 measurement means for measuring a key pressing period during which the key is pressed;
 judgment means for judging a type of a key input operation by comparing the key pressing period measured by the measurement means with a predefined judgment reference value;
 process means which performs a process according to the type of the key input operation judged by the judgment means; and
 update means for updating the judgment reference value on the basis of the key pressing period measured by the measurement means in a predetermined mode.

2. The operation input device according to claim 1, comprising a plurality of keys, at least one of which is the key for inputting the plurality of command signals according to the way of pressing the key.

3. The operation input device according to claim 2, wherein the key input operation type includes an ordinary key input operation, a longer pressing key input operation and a two-time pressing key input operation.

4. The operation input device according to claim 3, wherein the predetermined mode includes a judgment reference value determining mode which is different from an ordinary key input mode.

5. The operation input device according to claim 4, wherein the judgment reference value is determined for each user or each group of users of the operation input device.

6. The operation input device according to claim 5, further comprising means which inputs a signal for identifying a user or a user group who uses the operation input device prior to the use of the operation input device.

7. The operation input device according to claim 4, further comprising display means for providing a message for requesting to press the plurality of keys in a predetermined order,
wherein the measurement means measures key pressing periods during which the respective keys are pressed in response to the message, and the update means updates the judgment reference value on the basis of results of the measurement in the judgment reference value determining mode.

8. The operation input device according to claim 7, further comprising a liquid crystal display panel having a transparent touch panel provided on a surface thereof,
wherein the plurality of keys are displayed on the liquid crystal display panel.

9. The operation input device according to claim 8,
wherein a plurality of serial numbers are assigned to the respective keys, and displayed at random on the liquid crystal display panel,
wherein the display means displays a message for requesting to press the keys in numerical order.

10. The operation input device according to claim 7, wherein the update means includes calculation means which calculates an average of the key pressing periods measured by the measurement means.

11. The operation input device according to claim 10, wherein the update means includes means which calculates a standard deviation with respect to the average calculated by the calculation means.

* * * * *